(12) United States Patent
Janardhanan et al.

(10) Patent No.: US 9,948,312 B2
(45) Date of Patent: Apr. 17, 2018

(54) PHASE LOCK LOOP WITH A DIGITAL CHARGE PUMP

(71) Applicant: TEXAS INSTRUMENTS INCORPORATED, Dallas, TX (US)

(72) Inventors: Jayawardan Janardhanan, Bellevue, WA (US); Krishnaswamy Thiagarajan, Bangalore (IN); Jagdish Chand Goyal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/443,217

(22) Filed: Feb. 27, 2017

(65) Prior Publication Data

US 2017/0250693 A1 Aug. 31, 2017

(30) Foreign Application Priority Data

Feb. 29, 2016 (IN) .............................. 201641007438

(51) Int. Cl.
*H03L 7/087* (2006.01)
*H03L 7/06* (2006.01)
(Continued)

(52) U.S. Cl.
CPC ................... *H03L 7/087* (2013.01)

(58) Field of Classification Search
CPC ... H03L 7/087; H03L 7/08; H03L 7/06; H03L 7/00; H03D 13/00
(Continued)

(56) References Cited

U.S. PATENT DOCUMENTS 5,955,928 A * 9/1999 Smith ..................... H03L 7/07
331/11
6,552,618 B2 * 4/2003 Nelson .................. H03L 7/087
331/1 A
(Continued)

OTHER PUBLICATIONS

Kratyuk, V. et al., "Frequency detector for fast frequency lock of digital PLLs," Electronic Letters, Jan. 4, 2007, vol. 43, No. 1, (2 pages).

*Primary Examiner* — Brandon S Cole
(74) *Attorney, Agent, or Firm* — John R. Pessetto; Charles A. Brill; Frank D. Cimino

(57) ABSTRACT

A phase lock loop (PLL) includes a voltage-controlled oscillator (VCO) and a frequency detector to generate a FAST signal responsive to a frequency of a reference signal being greater than the frequency of a feedback signal derived from the VCO and to generate a SLOW signal responsive to the frequency of the reference signal being smaller than the frequency of the feedback signal. The PLL also includes a digital charge pump, a loop filter, and a state machine circuit. Responsive to receipt of multiple consecutive FAST signals when the digital charge pump is providing a charging current to the loop filter, the state machine circuit reconfigures the digital charge pump to increase the charging current to the loop filter. Responsive to receipt of multiple consecutive SLOW signals when the loop filter is discharging, the state machine circuit reconfigures the digital charge pump to cause the loop filter's discharge current to increase. Upon detection of a terminal condition, the state machine circuit may disable the digital charge pump and enable operation of an analog charge pump.

20 Claims, 3 Drawing Sheets

(51) Int. Cl.
*H03L 7/00* (2006.01)
*H03L 7/08* (2006.01)
*H03L 7/089* (2006.01)

(58) Field of Classification Search
USPC .............. 327/2–12, 105–123, 141, 144–163;
331/1 A, 15–17; 375/373–376
See application file for complete search history.

(56) References Cited

U.S. PATENT DOCUMENTS

| | | | |
|---|---|---|---|
| 7,042,253 B2* | 5/2006 | Su | H03L 7/099 327/11 |
| 7,078,977 B2* | 7/2006 | Maneatis | H03L 7/0893 327/156 |
| 7,420,427 B2* | 9/2008 | Brown | H03L 7/0893 331/10 |
| 8,373,460 B2* | 2/2013 | Sinha | H03L 7/089 327/150 |
| 9,791,482 B1* | 10/2017 | Carpenter, Jr. | G01R 19/2513 |
| 2004/0223575 A1* | 11/2004 | Meltzer | H03D 13/003 375/376 |
| 2012/0249198 A1* | 10/2012 | Sinha | H03L 7/089 327/157 |
| 2016/0112055 A1 | 4/2016 | Mirajkar et al. | |

* cited by examiner

PHASE LOCK LOOP WITH A DIGITAL CHARGE PUMP

CROSS-REFERENCE TO RELATED APPLICATIONS

The present application claims priority to Indian Provisional Patent Application No. 201641007438, filed Feb. 29, 2016, titled "A Fast Lock Scheme For Phase Lock Loop With External VCO," which is hereby incorporated herein by reference in its entirety.

BACKGROUND

Phase lock loops (PLLs) are circuits that generate an output signal whose phase and/or frequency is related to the phase/frequency of an input signal. In some implementations, the input signal may be a reference signal and the PLL adjusts the phase/frequency of its output signal to generally match the phase/frequency of the reference signal.

A PLL takes a finite amount of time to "lock" on to the frequency and phase of the reference signal. Some applications, however, may benefit from, or even require, a relatively short lock time. The Digital Mobil Radio (DMR) standard, for example, may require a PLL to lock within 1.5 ms for a maximum frequency difference of 60 MHz for the output signal. Other standards and applications may have different, yet stringent, specifications for a PLL's lock time.

SUMMARY

In accordance with at least one embodiment, a phase lock loop (PLL) includes a voltage-controlled oscillator (VCO) and a frequency detector to generate a FAST signal responsive to a frequency of a reference signal being greater than the frequency of a feedback signal derived from the VCO and to generate a SLOW signal responsive to the frequency of the reference signal being smaller than the frequency of the feedback signal. The PLL also includes a digital charge pump, a loop filter, and a state machine circuit. Responsive to receipt of multiple consecutive FAST signals when the digital charge pump is providing a charging current to the loop filter, the state machine circuit reconfigures the digital charge pump to increase the charging current to the loop filter. Responsive to receipt of multiple consecutive SLOW signals when the loop filter is discharging, the state machine circuit reconfigures the digital charge pump to cause the loop filter's discharge current to increase.

In another embodiment, an apparatus includes a VCO configured to generate an output signal and a frequency detector configured to receive the output signal or a feedback signal derived from the output signal. The apparatus also includes a digital charge pump configurable to source or sink current at any of a plurality of different magnitudes, a phase-frequency detector configured to receive the output signal or the feedback signal derived from the output signal, an analog charge pump configurable to source or sink current, and a loop filter coupled to the digital and analog charge pumps and to the VCO. The apparatus further includes a state machine circuit coupled to the digital charge pump, the frequency detector, and the phase-frequency detector. The state machine circuit is configured to repeatedly reconfigure the digital charge pump to vary the magnitude of charge current from the digital charge pump to the loop filter and to discharge current from the loop filter until a terminal condition is reached and then to disable the digital charge pump and enable the phase frequency detector.

In yet another embodiment, a method includes, based on control signals from a frequency detector, Iteratively reconfiguring a digital charge pump to source current to, or sink current from, a loop filter. The control signals may include a first control signal that is asserted responsive to a frequency of a reference signal being greater than a frequency of a VCO output signal or a feedback signal derived from the VCO output signal. The control signals also may include a second control signal that is asserted responsive to a frequency of the reference signal being smaller than the frequency of the VCO output signal or the feedback signal. The method further includes disabling the digital charge pump response to an occurrence of a terminal condition, and enabling an analog charge pump to source current to, or sink current from, the loop filter.

BRIEF DESCRIPTION OF THE DRAWINGS

For a detailed description of various examples, reference will now be made to the accompanying drawings in which.

DETAILED DESCRIPTION

The phase lock loop (PLL) disclosed herein includes a frequency detector and a corresponding digital charge pump, as well as a phase-frequency detector and a corresponding analog charge pump. The PLL also includes a state machine circuit, a voltage-controlled oscillator (VCO), and a loop filter. The frequency detector operates during an initial phase of the PLL locking its output signal to an input reference signal. During this initial phase, the frequency of the VCO output is iteratively adjusted through operation of the frequency detector, the state machine circuit and the digital charge pump. The digital charge pump is configurable to source (and/or sink) multiple different magnitudes of current to (and/or from) the loop filter. The state machine circuit iteratively adjusts the configuration of the digital charge pump to charge or discharge relatively high amounts of current to or from the loop filter as compared to the subsequent phase of operation in which the phase-frequency detector analog charge pump operate.

Once the state machine circuit detects a threshold state of operation of the digital charge pump, the state machine disables the digital charge pump and enables operation of the phase-frequency detector. The phase-frequency detector then continues the locking operation to further adjust the phase and/or frequency of the VCO's output to the reference signal. The magnitude of current sourced to or sinked from the analog charge pump is less than the current magnitude capability of the digital charge pump. Further, in some embodiments, unlike the digital charge pump, the analog charge pump may not be capable of multiple different magnitudes of charge/discharge current.

Figure 1:
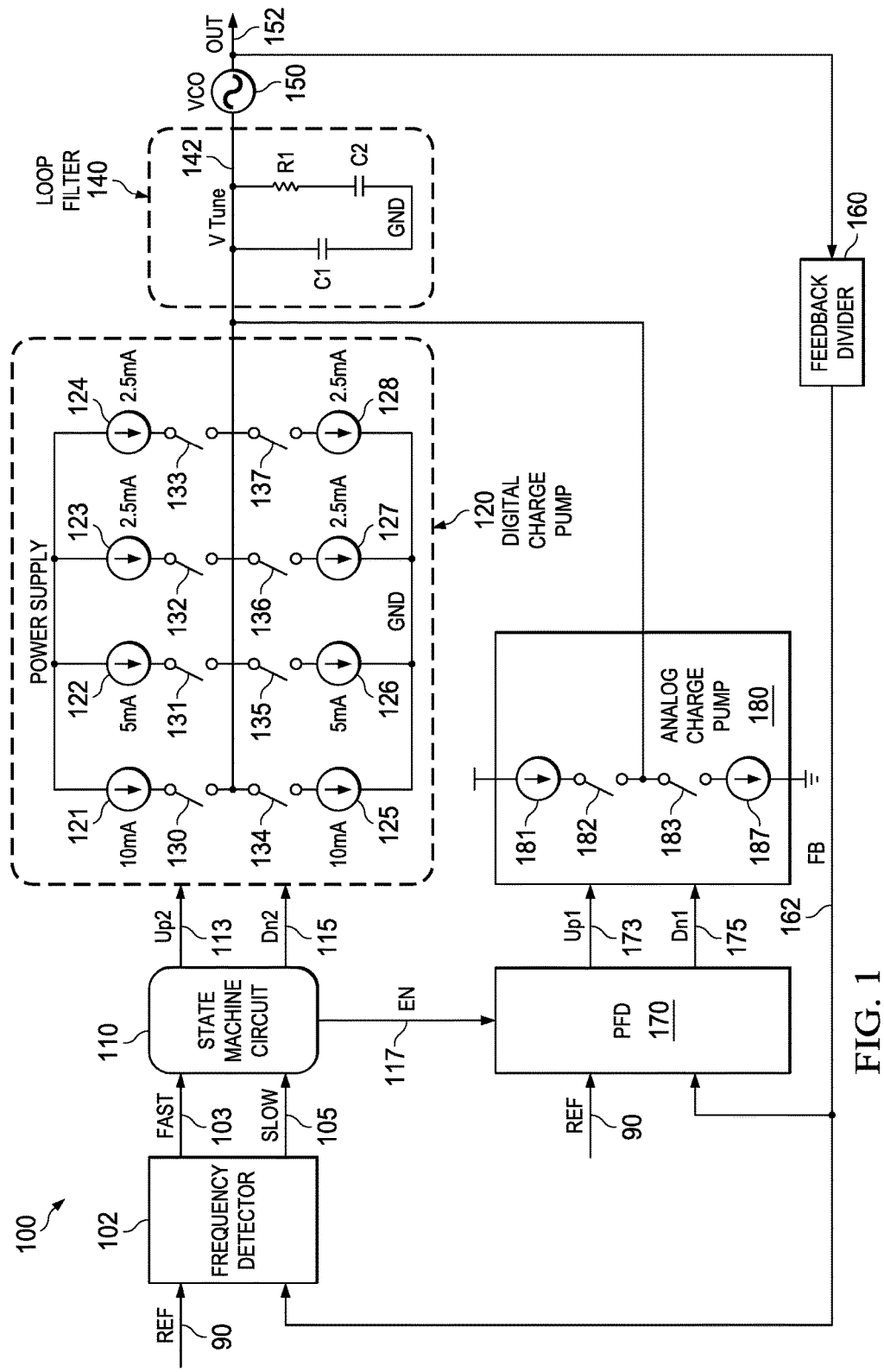
FIG. 1 shows an example of a phase lock loop (PLL) in accordance with various examples.

FIG. 1 shows an example a PLL 100 in accordance with an embodiment. The PLL 100 in this embodiment includes a frequency detector 102, a state machine circuit 110, a digital charge pump 120, a loop filter 140, a VCO 150, a feedback divider 160, a phase-frequency detector (PFD) 170, and an analog charge pump 180. The VCO 150 generates a periodic output signal 152 that is dynamically adjusted (in terms of frequency and/or phase) based on a voltage (VTune) 142 from the loop filter 150. For example, an increased voltage 142 from the loop filter 140 may cause the VCO 150 to increase the frequency of the output signal 152 and a reduced loop filter voltage 142 may cause the VCO to decrease its output signal frequency.

The loop filter 140 in the example of FIG. 1 includes a capacitor C1 connected in parallel with a series combination of a resistor R1 and a capacitor C2. Other circuit implementations for the loop filter 140 are possible as well. The loop filter 140 may determine loop stability and also may limit the amount of signal ripple that is applied to the VCO 150. The loop filter 140 may be implemented as a low-pass filter in some embodiments.

Both the digital charge pump 120 and analog charge pump 180 are configured to convert digital error pulses to analog error current to be filtered by the loop filter 140 and applied to the VCO 150 to adjust the output signal 152. The analog charge pump 180 may include current sources 181 and 187 and switches 182 and 188. Switches 182 and 188 are controlled by Up1 and Down1 (Dn1) control signals 173 and 175 from the phase-frequency detector 170. The Up signal 173 control switch 182 and the Dn control signal 175 controls switch 188. Up signal 173 closing switch 182 (with switch 188 being in an open state) causes current produced by current source 181 to flow to the loop filter and charge the capacitors C1 and C2. Dn signal 175 closing switch 188 (with switch 182 in an open state) causes the capacitors of the loop filter to begin to discharge current under control of current source 187. The analog charge pump 180 thus generates a voltage VTUNE 142 based on the Up1 and Dn1 control signals 173, 175, and provides the voltage VTUNE to the VCO 150.

The output signal 152 from the VCO 150 may be provided to the feedback divider 160. The feedback divider 160 generates a feedback (FB) signal 162 based on the VCO's output signal 152. The FB signal 162 may have a frequency that is a divided down version of the frequency of output signal 152. The frequency division generated by the feedback divider may implement an integer fraction (e.g., ½, ⅓, etc.). That is, the frequency of FB 162 may be one-half, one-third, etc. of the frequency of the output signal 152. Some embodiments may not employ a frequency divider, and instead the output signal 152 is the FB signal 162.

The phase-frequency detector 170 receives as inputs the FB signal 162 (i.e., a signal derived from the VCO's output signal 152) as well as a reference signal (REF) 90. The reference signal 90 is any periodic signal for which the PLL 100 is to lock its output signal 152.

Referring still to FIG. 1, the digital charge pump 120 includes multiple selectable current sources. In the example shown, the digital charge pump 120 includes four current sources 121, 122, 123, and 124 configured to provide charging current to the capacitors C1, C2 of the loop filter 140 (and thus to the loop filter). A corresponding number of switches are provided as well for the current sources 121-124, and are individually controlled by signals from the state machine circuit 110 to permit current from the corresponding current source to flow to and charge the loop filter. For example, switch 130 connects current source 121 to the loop filter and switch 131 connects current source 122 to the loop filter. Similarly, switches 132 and 133 connect corresponding current sources 123 and 124 to the loop filter. In this example, current source 121 generates a 10 mA current and current source 122 generates a 5 mA current, while current sources 123 and 124 are both 2.5 mA current sources, although other current levels can be implemented. In various embodiments, the digital charge pump may have more or fewer than four charging current sources and at least two of the charging current sources are of different current magnitudes.

The digital charge pump includes a similar configuration for discharging current sources 125-128, that is, current sources through which the loop filter can discharge to ground. A corresponding set of individually activated switches 134-137 connect to the discharging current sources 125-128, as shown. The loop filter can discharge through any of the discharging current sources 125-128 based on the state of the switches 134-137.

The Up signal 113 from the state machine circuit 110 may comprise multiple control signals—one for each of the switches 130-133. Similarly, the Dn2 signal 115 from the state machine circuit 110 may comprise multiple control signals—one for each of the switches 134-137. The switches for any of the charging current sources 121-124 can be closed to thereby cause the current from the corresponding current source 121-124 to flow to the loop filter to charge the filter. Charge in the loop filter can be removed as well by closing any of the switches 134-137 to let discharge current flow from the loop filter and through a current source connected to a closed switch 134-137 to ground.

Because the various current sources 121-124 are of different current magnitudes (although some of the current sources may be of the same current magnitude), the charge current to the loop filter can be dynamically adjusted through the Up2 signal 113. For example, only switch 133 may be closed thereby forcing 2.5 mA of charge current into the loop filter. Alternatively, switches 132 and 133 both can be closed thereby forcing 2.5 mA of charge current from each of current sources 123 and 124 into the loop filter for a combined 5 mA of charge current. If only switch 130 is closed, then the charge current will be sourced by current source 121 and be 10 mA. If all four switches 130-133 were closed, then the combined charge current from all four current sources will be 20 mA (10 mA+5 mA+2.5 mA+2.5 mA). Other charge current magnitudes are possible as well by different configuration of the switches 130-133. Similar discharge current configurations are possible as well through selective operation of switches 134-137 by Dn2 signal 115. That is, the discharge current magnitudes may comprise 2.5 mA, 5 mA, 10 mA, and 20 mA, although other discharge current magnitudes are possible as well.

The frequency detector 102 may generate FAST and SLOW control signals 103 and 105 based on a comparison of the frequencies of the reference signal 90 and the feedback signal 162. Each of the FAST and SLOW control signals 103, 105 may comprise a voltage pulse. In the example of FIG. 1, the FAST control signal 103 is asserted if the frequency of the reference signal 90 is greater than the frequency of the feedback signal 162. Through operation of the state machine circuit 110, digital charge pump 120, and loop filter 140, the FAST control signal 103 causes the VCO 150 to increase the frequency of its output signal 152. Similarly, the SLOW control signal 105 is asserted by the frequency detector 102 if the frequency of the reference signal 90 is smaller than the frequency of the feedback signal 162. Through operation of the state machine circuit 110, digital charge pump 120, and loop filter 140, the SLOW control signal 105 causes the VCO 150 to decrease the frequency of its output signal 152.

The state machine circuit 110 may comprise a programmable controller executing machine instructions, a programmable logic device, or any other type of circuit that can be configured or programmed to perform the functionality described herein. The state machine circuit 110 may be implemented as an integrated circuit. Based on its current operating state, the state machine circuit 110 responds to the assertion of the SLOW and FAST control signals from the frequency detector 102 as described below with reference to FIG. 3. By way of overview, the state machine circuit 110 causes the digital charge pump 120 to vary its charge or discharge currents to force the VCO to vary the output signal's frequency to become closer to the frequency of the reference signal 90. The state machine circuit 110 may operate the digital charge pump to initially generate a high charge or discharge current to more quickly achieve lock by the PLL 100.

Once the frequency of the output signal 152 becomes close to the frequency of the reference signal 90, the state machine circuit 110 disables the operation of the digital charge pump 120 and enables phase-frequency detector 170. FIG. 1 illustrates an enable signal (EN) 117 controlled by the state machine circuit 110 and provided to the phase-frequency detector 117. In one logic state, the enable signal 117 disables the operation of the phase-frequency detector 117, and in the opposite logic state, the enable signal enables the operation of the phase-frequency detector. The PLL 100 thus achieves lock through a two-step operation. A first step includes the operation of the digital charge pump 120 with relatively high charge and/or discharge current levels, and a second step uses the analog charge pump 180 for more finely controlling the phase and frequency of the output signal 152 using a current level that may be significantly lower than that of the first step.

Figure 2:
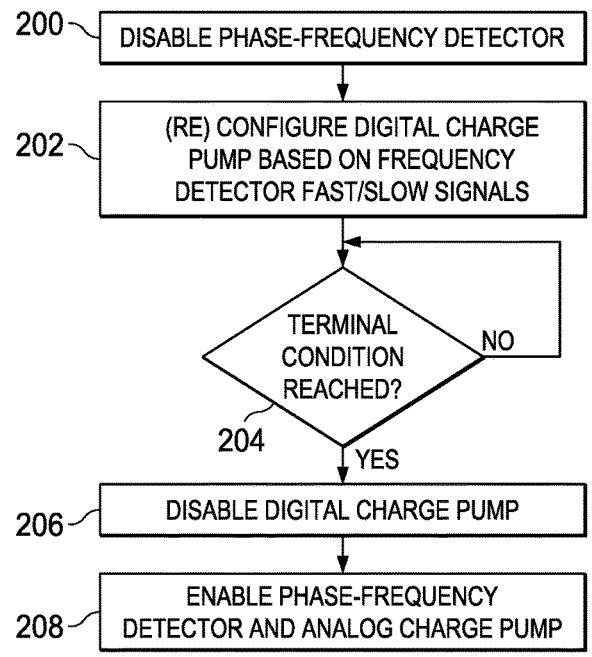
FIG. 2 shows a flow diagram illustrating the operation of the PLL in accordance with various examples.

FIG. 2 illustrates and example of a method in accordance with various embodiments. The operations may be performed in the order shown, or in a different order. Further, the operations may be performed sequentially, or two or more of the operations may be performed concurrently.

At 200, the method includes disabling the phase-frequency detector 170 (or not enabling detector 170 from an initial disabled state). With the phase-frequency detector 170 disabled, the analog charge pump 180 also is operationally disabled and will not charge or discharge the loop filter 140. In another embodiment, the analog charge pump 180 itself may have an enable/disable capability and the analog charge pump is disabled instead of or in addition to the phase-frequency detector 170. In some embodiments, the state machine circuit 110 de-asserts an enable (EN) signal 117 to the phase-frequency detector 170 to disable the phase-frequency detector. That is, in one logic state the enable signal 117 disables the phase-frequency detector and in another logic state the enable signal enables the phase-frequency detector.

Figure 3:
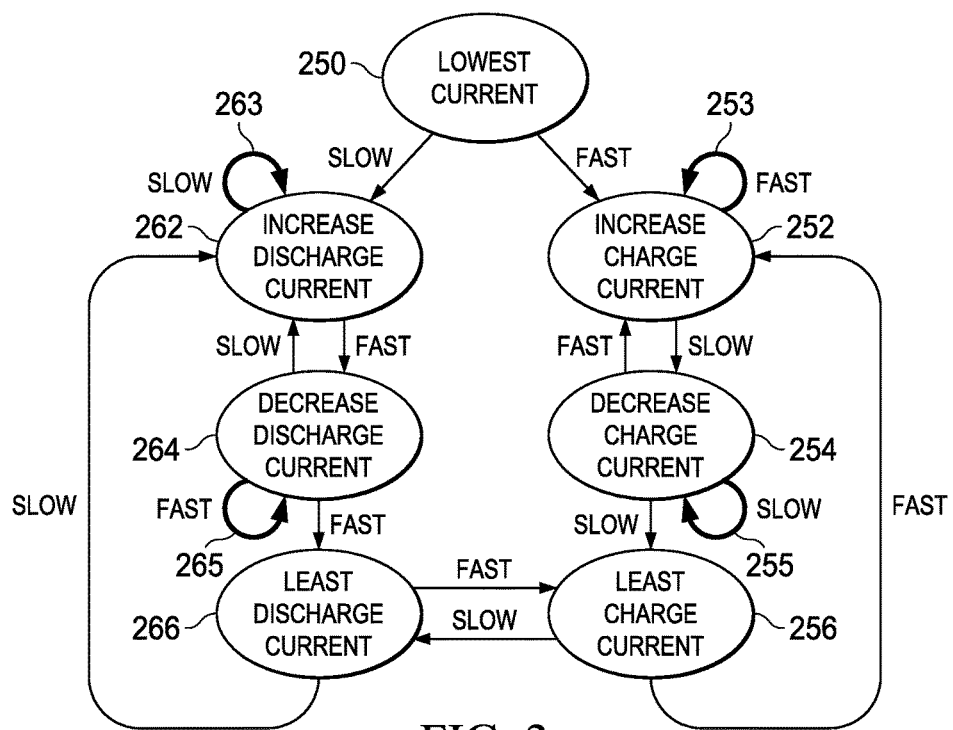
FIG. 3 illustrates a method for reconfiguring a digital charge pump in accordance with various examples.

At 202, the method includes configuring or reconfiguring the digital charge pump 120 based on the FAST and SLOW signals from the frequency detector 202. FIG. 3 shows an example of the operation of the state machine circuit 110 to configure and reconfigure the digital charge pump. As discussed above, the digital charge pump 120 can be configured by the state machine circuit 110 for multiple different charge currents and multiple different discharge currents. In the example of FIG. 3, the state machine circuit initially configures the digital charge pump for the lowest possible current as represented by state 250. The state transitions in the example of FIG. 3 may be implemented by the state machine circuit 110 according to the following illustrative rules:

If the loop filter is currently receiving a charge current from the digital charge pump 120, the state machine circuit reconfigures the digital charge pump to increase the magnitude of the charging current responsive to multiple (e.g., 2) consecutive FAST signal assertions;

If the loop filter is currently receiving a charge current, the state machine circuit reconfigures the digital charge pump to decrease the magnitude of the charging current responsive to a receipt of a single SLOW signal following a prior FAST signal (i.e., a change in the relative states of the FAST and SLOW signals);

If the loop filter is currently discharging through the digital charge pump, the state machine circuit reconfigures the digital charge pump to increase the magnitude of the discharge current responsive to multiple (e.g., 2) consecutive SLOW signal assertions; and If the loop filter is currently discharge current, the state machine circuit reconfigures the digital charge pump to decrease the magnitude of the discharging current responsive to a receipt of a single FAST signal following a prior SLOW signal.

In state 250, the state machine circuit 110 configures the digital charge pump 120 to operate in the lowest charging current mode if an initial assessment of the frequency of the output signal 152 from the VCO is smaller than the frequency of the reference signal 90. If the initial assessment is that the frequency of the output signal 152 is greater than the reference signal 90, then the state machine circuit 110 initially configures the digital charge pump 120 for the lowest possible discharge current in state 250.

Assume that the initial current setting is at the lowest charging current to charge the loop filter to thereby increase the frequency of the output signal 152 of the VCO 150. While in that state, if two consecutive FAST signals are received by the state machine circuit 110 from the frequency detector 102, the state machine circuit transitions to state 252 in which the state machine circuit dynamically reconfigures the digital charge pump 120 to increase the magnitude of the charge current to the loop filter. Changing the configuration of the digital charge pump 120 may comprise changing the state of one or more of the switches 130-133. For example, if switch 133 was closed initially to force 2.5 mA of charge current from current source 124 to the loop filter, switch 132 also may be closed. With both switches 132 and 133 closed, a total of 5 mA of charge current flows from the digital charge pump 120 to the loop filter. Alternatively, switch 133 may be opened by the state machine circuit and switch 131 closed to select the 5 mA current source 122. As explained above, the Up2 signal 113 may comprise multiple control signals to control the various switches 130-133 in the digital charge pump 120.

Upon receipt by the state machine circuit 110 of another two consecutive FAST signals 103, the state machine circuit again increases the magnitude of the charge current. This process is indicated by the loop 253 at state 252. The state machine circuit continues to increase the charge current upon receipt of sets of consecutive FAST signals until the maximum charge current producible by the digital charge pump 120 is reached (e.g., 20 mA). At that point, the digital charge pump 120 continues to provide its maximum charge current to the loop filter even if consecutive FAST signals are still received by the state machine circuit 110.

Changes to the charge (or discharge) current of the digital charge pump and loop filter may be made in incremental steps. That is, if the digital charge pump 120 is capable of being configured for four different charge current magnitudes, the state machine circuit 110 increments the current magnitude in sequence through each of the four charge current magnitudes from lowest to highest.

While at state 252 in which the digital charge pump 120 generates charging current, if the state machine circuit 110 receives an assertion of a SLOW signal 105 after an immediately previous FAST signal, the state implemented by the state machine circuit changes from state 252 to state 254. As explained above, a SLOW signal 105 indicates that the frequency of the VCO output signal 152 is greater than that of the reference signal 90 and should be decreased. At state 254, the state machine circuit 110 dynamically reconfigures the digital charge pump 120 to decrease the charge current. While at that state, the state machine circuit 110 may receive either a FAST signal 103 or a SLOW signal 105. Receipt of multiple consecutive SLOW signals causes the state machine circuit 110 to again reconfigure the digital charge pump 120 for generation of an even lower charge current (as indicated by loop 255). Alternatively, receipt of a single FAST signal following the transition to state 254 causes the state machine circuit 110 to change its state back to state 252 to thereby reconfigure the digital charge pump 120 to increase the charge to the loop filter. The state of the state machine circuit 110 may toggle back and forth between states 252 and 254 upon successive changes between the FAST and SLOW signals (FAST followed by SLOW, or SLOW followed by FAST). As such, the state machine circuit 110 is configured to dynamically reconfigure the digital charge pump 120 to continue to increase the charge current upon receipt of consecutive FAST signals, increase the charge current upon receipt of a single FAST signal after previous receipt of one or more SLOW signals, and decrease the charge current upon receipt of a single SLOW signal after previous receipt of one or more FAST signals, and also upon receipt of a consecutive SLOW signals.

The left-hand set of states 262 and 264 in FIG. 3 functions in much the same as the right-hand side except for discharging the loop filter. Assume at state 250 the initial current setting is at the lowest discharge current from the loop filter to thereby decrease the frequency of the output signal 152 of the VCO 150. While in that state, if two consecutive SLOW signals are received by the state machine circuit 110 from the frequency detector 102, the state machine circuit transitions to state 262 in which the state machine circuit dynamically reconfigures the digital charge pump 120 to increase the magnitude of the discharge current from the loop filter. Changing the configuration of the digital charge pump 120 to vary the level of the discharge current may comprise changing the state of one or more of the switches 134-137 to select one or more desired discharge current sources 125-128. As explained above, the Dn2 signal 115 may comprise multiple control signals to control the various switches 134-137 in the digital charge pump.

Upon receipt by the state machine circuit 110 of another two consecutive SLOW signals 105, the state machine circuit again increases the magnitude of the discharge current. This process is indicated by the loop 263 at state 262. The state machine circuit continues to increase the discharge current upon receipt of consecutive SLOW signals until the maximum discharge current producible by the digital charge pump 120 is reached. At that point, the digital charge pump continues to sink the maximum discharge current from the loop filter even if consecutive SLOW signals are still received by the state machine circuit 110.

While at state 262 in which the digital charge pump 120 sinks discharge current from the loop filter, if the state machine circuit 110 receives an assertion of a FAST signal 103 after an immediately previously SLOW signal, the state machine circuit changes from state 262 to state 264. As explained above, a FAST signal 105 indicates that the frequency of the VCO output signal 152 is smaller than that of the reference signal 90 and should be increased. At state 264, the state machine circuit 110 dynamically reconfigures the digital charge pump 120 to decrease the discharge current. While at that state, the state machine circuit 110 may receive either a FAST signal 103 or a SLOW signal 105. Receipt of multiple consecutive FAST signals causes the state machine circuit to again reconfigure the digital charge pump 120 to sink even lower levels of discharge current from the loop filter as indicated by loop 265). Alternatively, receipt of a single SLOW signal following the transition to state 264 causes the state machine circuit to change its state back to state 262 to thereby reconfigure the digital charge pump to increase the discharge from the loop filter. The state of the state machine circuit 110 may toggle back and forth between states 262 and 264 upon successive changes between the FAST and SLOW signals (FAST followed by SLOW, or SLOW followed by FAST). As such, the state machine circuit 110 is configured to dynamically reconfigure the digital charge pump 120 to continue to increase the discharge current upon receipt of consecutive SLOW signals, increase the discharge current upon receipt of a single SLOW signal after previous receipt of one or more FAST signals, and decrease the discharge current upon receipt of a single FAST signal after previous receipt of one or more SLOW signals or receipt of multiple consecutive FAST signals.

As the charge current is increased in state 252 and then decreased through state 254 as explained above, eventually the state of the state machine circuit 110 reaches state 256 as a result of asserted SLOW signals. The digital charge pump 120 is configured to source the last amount of current to the loop filter in state 256. Thus, the charge current is again at its lowest level. A further assertion of consecutive SLOW signals causes the transition to state 266 as shown in which the state machine circuit 110 configures the digital charge pump 120 for the lowest discharge current. At that point, receipt of a FAST signal causes the state machine circuit to revert back to state 256 at which the digital charge pump is reconfigured for the lowest charge current. The states may continue to toggle between states 256 and 266 upon alternating receipt of SLOW and FAST signals. Entry into state 266 (and thus toggling between states 266 and 256) also can occur from state 264 upon continued receipt of consecutive FAST signals.

Referring back to FIG. 2, following the operations involved in reconfiguring the digital charge pump 120 based on the FAST and SLOW signals (an example of which is illustrated in FIG. 3), the method includes determining whether at 204 a threshold condition (also termed a "terminal" condition) is reached. In one example, the terminal condition may comprise a threshold number of state changes between low charge/discharge current states 256 and 266. The threshold number may be preconfigured and can be any desired value including, for example, 20, 30, 40, etc. The state machine circuit 110 includes a software or hardware counter to count the number of state transitions between states 256 and 266.

Once the number of state transitions reaches the threshold, the state machine circuit 110 may disable the digital charge pump 120 at operation 206. The act of disabling the digital charge pump may include causing all of the switches 130-137 to be in their open state thereby preventing the digital charge pump from sourcing charge current to, or sinking discharge current from, the loop filter 140.

At 208, the method includes enabling the phase-frequency detector 170 and analog charge pump 180 to further charge and discharge the loop filter 140 to fine tune the VCO's output frequency and phase.

Figure 4:
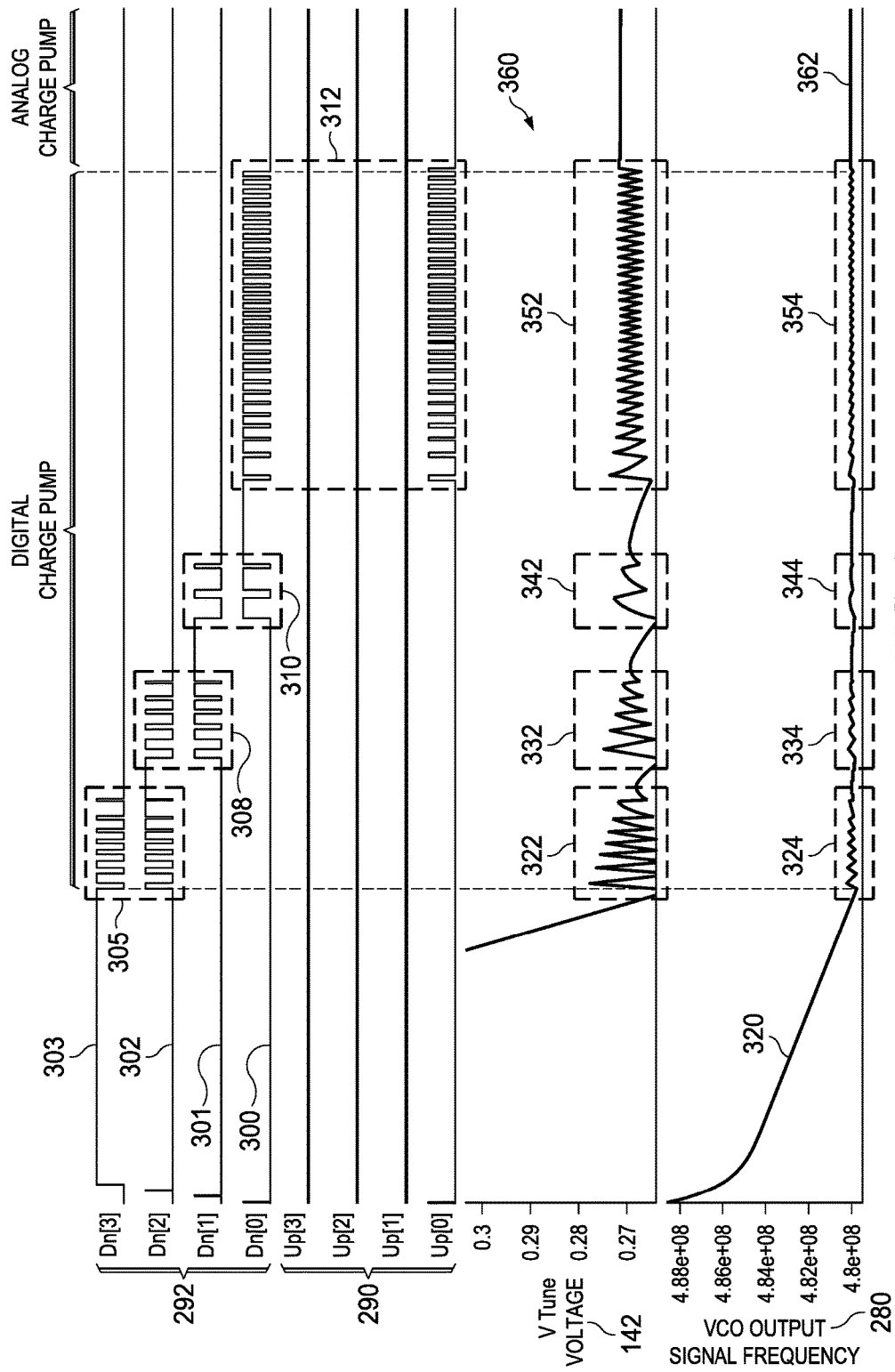
FIG. 4 shows a timing diagram in accordance with various examples.

FIG. 4 shows a timing diagram illustrating the operation of the PLL 100. In this example, the frequency of the VCO output signal is higher than the frequency of the reference signal and the PLL reacts as described above to decrease the VCO output frequency. The bottom trace 280 is the frequency of the VCO output signal 152. The trace above that is the voltage VTune 142, which is the voltage of the loop filter's output (i.e., the input voltage to the VCO 150). The four traces identified at 290 represent the Up2 signals 113 and the four traces identified at 292 represent the Dn2 signals 115. The Up2 signals are shown as Up[1], Up[2], Up[3], and Up[4], while the Dn2 signals are shown as Dn[1], Dn[2], Dn[3], and Dn[4]. As explained above, the state machine circuit 110 can configure the digital charge pump 120 for any of multiple different charge current levels and multiple different discharge current levels. In the example, of FIG. 4, there are four discharge current levels and four charge current levels. In an example above, the four discharge and four charge current levels include 2.5 mA, 5 mA, 10 mA and 20 mA.

The Dn[0] trace represents the Dn2 control signal to control the switches 134-137 in the digital charge pump 120 to effectuate the lowest discharge current (e.g., 2.5 mA). The Dn[1:3] traces represent the Dn2 control signals to control the switches 134-137 to effectuate the next highest discharge current levels (5 mA, 10 mA and 20 mA, respectively). Similarly, the Up[0] trace represents the Up2 control signal to control the switches 130-133 in the digital charge pump 120 to effectuate the lowest charge current (e.g., 2.5 mA). The Up[1:3] traces represent the Up2 control signals to control the switches 130-133 to effectuate the next highest charge current levels (5 mA, 10 mA and 20 mA, respectively).

In the timing diagram example of FIG. 4, the VCO frequency is initially determined to be too high (i.e., higher than the reference signal frequency). The state machine circuit 110 configures the digital charge pump 120 for generation of the smallest discharge current. The configuration of the digital charge pump for the smallest discharge current is represented by a pulse on Dn[0] as shown at 300. Reference numerals 301, 302, and 303 show consecutive increases in the discharge current from the lowest setting to the highest setting in response to consecutive assertions of SLOW signals (not shown in FIG. 4) from the frequency detector 102. In response, the VCO output signal frequency begins to decrease as shown at 320. The VTune voltage 142 also begins to drop as well.

Reference numeral 305 illustrates the toggling of current discharge states between 262 and 264. The discharge states may be between discharging 20 mA and 10 mA of current. The VTune voltage 142 increases and decreases as shown at 322 in response to the changes in the discharge current level. Similarly, a ripple is shown on the VCO output signal frequency at 324.

After a number of times that the states 262 and 264 have toggled back and forth, the discharge current is further decreased and then begins to toggle at 308 again between states 262 and 264 but for a pair of lower discharge current levels. For example, while at 305 the digital charge pump may be dynamically configured by the state machine circuit between 20 mA of discharge current and 10 mA of discharge current, at 308 the digital charge pump is configured between 10 mA of discharge current and 5 mA of discharge current. Reference numerals 332 and 334 illustrate the ripple effect on the VTune voltage 142 and the VCO output signal frequency, respectively.

The charge current further is decreased and the state machine circuit again repeatedly configures the digital charge pump to toggle between producing 5 mA of discharge current and 2.5 mA of discharge current (310). Reference numerals 342 and 344 illustrate the ripple effect on the VTune voltage 142 and the VCO output signal frequency, respectively.

Finally, the state machine circuit 110 toggles back and forth between states 256 and 266 thereby configuring the digital charge pump to be configured back and forth between its lowest charge and discharge current modes (e.g., between 2.5 mA of charge current and 2.5 mA of discharge current). The toggling of the states between 256 and 266 continues as shown at 312 and reference numerals 352 and 354 illustrate the ripple effect on the VTune voltage 142 and the VCO output signal frequency, respectively. The toggling of discharge current states at 312 continues until the terminal condition is reached (e.g., the number of oscillations between the 256 and 266 states reaches a threshold value). At that point as represented by the vertical line 360, the state machine circuit 110 disables the digital charge pump and enables operation of the phase-frequency detector and the analog charge pump.

The frequency of the VCO output frequency is finally locked on (as illustrated at 362) to the frequency of the reference signal 90 with a short period of time following operation of the analog charge pump. In one example, the entire time to lock the VCO output signal on to the frequency and phase of the reference signal is less or equal to 1.5 ms, but can be different than 1.5 ms for other applications and implementations.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A phase lock loop (PLL), comprising:
    a voltage-controlled oscillator (VCO) configured to generate an output signal;
    a frequency detector configured to determine whether a frequency of a reference signal is greater or smaller than a frequency of a feedback signal derived from the VCO's output signal and to generate a FAST signal responsive to the frequency of the reference signal being greater than the frequency of the feedback signal and to generate a SLOW signal responsive to the frequency of the reference signal being smaller than the frequency of the feedback signal;
    a digital charge pump including a plurality of selectable current sources;
    a loop filter coupled to the digital charge pump and comprising a capacitor; and
    a state machine circuit coupled to the digital charge pump and the frequency detector and configured to:
        responsive to receipt of multiple consecutive FAST signals when the digital charge pump is providing a charging current to the loop filter, reconfigure the digital charge pump to increase the charging current to the loop filter; and
        responsive to receipt of multiple consecutive SLOW signals when the loop filter is discharging, reconfigure the digital charge pump to cause the loop filter's discharge current to increase.

2. The PLL of claim 1, wherein, when the digital charge pump is providing a charging current to the filter and responsive to a SLOW signal immediately following a FAST signal, the state machine circuit is configured to reconfigure the digital charge pump to decrease the charging current to the filter.

3. The PLL of claim 1, wherein, when the filter is discharging and responsive to a FAST signal immediately following a SLOW signal, the state machine circuit is configured to reconfigure the digital charge pump to thereby cause a decrease in the discharge current from the filter.

4. The PLL of claim 1, wherein the state machine circuit is configured to:
iteratively reconfigure the digital charge pump between two states comprising one state in which charging current is provided to the loop filter and another state in which the loop filter is discharged;
count a number of iterations; and
disable the digital charge pump when the count of the number of iterations reaches a threshold.

5. The PLL of claim 4, further comprising:
an analog charge pump coupled to the loop filter; and
a phase-frequency detector coupled to the analog charge pump and configured to assert control signals to the analog charge pump based on the reference signal and the feedback signal; and
wherein the state machine is configured to assert an enable signal to the phase-frequency detector responsive to the count of the number of iterations reaching the threshold.

6. The PLL of claim 4, wherein the digital charge pump includes a plurality of switches, a separate switch for each of the plurality of current sources, and wherein the state machine circuit is configured to disable the digital charge pump through configuration of each the switches to prevent current from flowing through any of the plurality of current sources.

7. The PLL of claim 1, wherein:
the plurality of selectable current sources includes at least four current sources to provide a charging current to the loop filter, and at least four current sources usable to discharge the loop filter;
of the at least four current sources to charge the loop filter, at least two current sources are of different current magnitudes; and
of the at least four current sources to discharge the loop filter, at least two current sources are of different current magnitudes.

8. The PLL of claim 1, further comprising a feedback frequency divider configured to receive the VCO output signal at a first frequency and generate the feedback signal at a second frequency, wherein the second frequency is smaller than the first frequency.

9. An apparatus, comprising:
a voltage-controlled oscillator (VCO) configured to generate an output signal;
a frequency detector configured to receive the output signal or a feedback signal derived from the output signal;
a digital charge pump configurable to source or sink current at any of a plurality of different magnitudes;
a phase-frequency detector configured to receive the output signal or the feedback signal derived from the output signal;
an analog charge pump configurable to source or sink current;
a loop filter coupled to the digital and analog charge pumps and to the VCO; and
a state machine circuit coupled to the digital charge pump, the frequency detector, and the phase-frequency detector and configured to repeatedly reconfigure the digital charge pump to vary the magnitude of charge current from the digital charge pump to the loop filter and to discharge current from the loop filter until a terminal condition is reached and then to disable the digital charge pump and enable the phase frequency detector.

10. The system of claim 9, wherein:
the frequency detector is configured to determine whether a frequency of the reference signal is greater or smaller than a frequency of the feedback signal derived from the VCO's output signal and to generate a FAST signal responsive to the frequency of the reference signal being greater than the frequency of the feedback signal and to generate a SLOW signal responsive to the frequency of the reference signal being smaller than the frequency of the feedback signal; and
the state machine circuit is configured to:
when the digital charge pump is sourcing current to the loop filter and responsive to receipt of a SLOW signal immediately following a FAST signal, the state machine circuit is configured to reconfigure the digital charge pump to decrease the charging current to the loop filter; and
wherein, when the loop filter is discharging and responsive to receipt of a FAST signal immediately following a SLOW signal, the state machine circuit is configured to reconfigure the digital charge pump to thereby cause a decrease in the discharge current from the loop filter.

11. The apparatus of claim 9, wherein the terminal condition comprises a threshold number of transitions between the digital charge pump configured to source current to the loop filter and the digital charge pump configured to sink current from the loop filter.

12. The apparatus of claim 9, wherein the digital charge pump includes a plurality of switches and a plurality of current sources, a separate switch for each of the plurality of current sources.

13. The apparatus of claim 12, wherein the state machine circuit is configured to disable the digital charge pump through configuration of each of the switches to an off state to thereby prevent current from flowing through any of the plurality of current sources.

14. The apparatus of claim 12, wherein the state machine is configured to repeatedly reconfigure the digital charge pump through control of the switches.

15. The apparatus of claim 12, wherein the plurality of current sources includes at least two source current sources of different current magnitudes and at least two sink current sources of different magnitudes.

16. A method, comprising:
based on control signals from a frequency detector, Iteratively reconfiguring a digital charge pump to source current to, or sink current from, a loop filter, the control signals including a first control signal that is asserted responsive to a frequency of a reference signal being greater than a frequency of a voltage-controlled oscillator (VCO) output signal or a feedback signal derived from the VCO output signal and a second control signal that is asserted responsive to a frequency of the reference signal being smaller than the frequency of the VCO output signal or the feedback signal;

disabling the digital charge pump response to an occurrence of a terminal condition; and enabling an analog charge pump to source current to, or sink current from, the loop filter.

17. The method of claim 16, wherein the terminal condition comprises a threshold number of transitions between the digital charge pump configured to source current to the loop filter and the digital charge pump configured to sink current from the loop filter.

18. The method of claim 16, wherein iteratively reconfiguring the digital charge pump comprises configuring the digital charge pump to increase source current to the loop filter responsive to consecutive assertions of the first control signal.

19. The method of claim 18, wherein iteratively reconfiguring the digital charge pump further comprises configuring the digital charge pump to increase sink current from the loop filter responsive to consecutive assertions of the second control signal.

20. The method of claim 16, wherein iteratively reconfiguring the digital charge pump further comprises:

wherein, when the digital charge pump is sourcing current to the loop filter and responsive to a second control signal immediately following a first control signal, configuring the digital charge pump to decrease the source current to the loop filter; and wherein, when the digital charge pump is sinking current from the loop filter and responsive to a first control signal immediately following a second control signal, reconfiguring the digital charge pump to decrease the sink current from the loop filter.

* * * * *